United States Patent [19]

Lohmann

[11] 3,949,384

[45] Apr. 6, 1976

[54] SYNCHRONOUS SHIFT REGISTER WITH SERIES AND PARALLEL DATA INPUT AND BASIC POSITION INPUT

[75] Inventor: Heinz-Juergen Lohmann, Braunschweig, Germany

[73] Assignee: Siemens Aktiengesellschaft, Germany

[22] Filed: Feb. 10, 1975

[21] Appl. No.: 549,017

[30] Foreign Application Priority Data
Mar. 27, 1974 Germany............................ 2414874

[52] U.S. Cl............. 340/173 FF; 307/291; 328/37; 328/42
[51] Int. Cl.²......................................... G11C 13/00
[58] Field of Search .................. 340/173 R, 173 FF; 307/238, 279, 291; 328/37, 42

[56] References Cited
UNITED STATES PATENTS
3,641,511  2/1972  Cricchi et al................... 340/173 FF Primary Examiner—Terrell W. Fears
Attorney, Agent, or Firm—Hill, Gross, Simpson, Van Santen, Steadman, Chiara & Simpson

[57] ABSTRACT

A synchronous shift register has serial and parallel data inputs and a basic position input. The individual stages of the shift register are each constructed with a master-slave flip-flop which is fed back by way of a majority decision element. To the set and reset inputs of the storage elements an additional majority decision circuit is connected by which the stages are connected in series and over which the input and output, respectively, of data takes place. The synchronous shift register requires little construction effort and serves as a safety circuit system. In a safety circuit system dual channel processing is provided. If the processing takes place accurately, out of phase (anti-phase) signals appear in the channels.

2 Claims, 6 Drawing Figures

SYNCHRONOUS SHIFT REGISTER WITH SERIES AND PARALLEL DATA INPUT AND BASIC POSITION INPUT

BACKGROUND OF THE INVENTION

1. Field of the Invention

This invention relates to a synchronous shift register having series and parallel data inputs and a basic position input and utilizes a number of storage elements which are connected in series. Each of the storage elements is constructed from a master-slave flip-flop and a majority decision circuit for two variables applied to the set and reset inputs and a third variable fed back from the output of the slave is connected with the first input of the master and to its second input by way of an inverter so that the storage element fulfills the truth table

| S | R | Qto | Qtl |
|---|---|-----|-----|
| L | O | O | O |
| L | L | O | L |
| O | L | L | L |
| O | O | L | O |
| L | O | L | L |
| L | L | L | L |
| O | L | O | O |
| O | O | O | O | which corresponds to the Boolean equation $$Qt1 = S \cdot R + Qto \cdot (S + R).$$

2. Description of the Prior Art

Shift registers are connected in the form of a chain and can be utilized as parallel-series converters and also vice versa as series-parallel converters. In contrast to the known matrix-type constructed memories in which individual data bits are recorded in the various storage cells where they remain until a change takes place, or until they are recalled, in the case of the shift register constructed as a chain, a data total in the form of a bit pattern is always processed simultaneously. This bit pattern which is contained in the individual storage cells of the shift register is shifted, in general, synchronously into the respective adjacent storage cell by a pulse which is provided in common to all of the storage cells.

SUMMARY OF THE INVENTION

There is a distinction between clockwise and counterclockwise shifted registers, as is well known to those versed in the art. The present invention deals with a synchronous shift register having clockwise shifting. If the input and output of such a shift register are connected together, data fed in the form of a bit pattern can circulate continuously until it is erased, while continuously stepping from storage cell to storage cell. Without this feedback, a serially or parallel fed in bit pattern can be serially output at the end of the shift register from the last storage cell.

However, it is also possible, in the case of an interruption in stepping, to read and interrogate the entire bit pattern which is present in the shift register via the individual outputs which are associated with the individual storage cells.

The present invention is based on the object of creating a synchronous shift register with series and parallel inputs, while utilizing specific electronic storage elements of the type initially mentioned which are intended for digital data processing systems of high fault safety and which are generally described in the British Letters Patent 1,357,862.

Another object of the invention is to provide a shift register with a basic position input by way of which a randomly fed in bit pattern can be erased. Since the above mentioned storage elements are constantly connected to the pulse current supply, independently from whether or not data is to be passed on in a shift register constructed with the storage elements, a separate input for a respective switch-on order is to be provided for the shifting process. The expenditures of digital switching elements for the individual storage elements in accordance with the above-state of plurality of control objects of shift register remains small.

BRIEF DESCRIPTION OF THE DRAWINGS

Other objects, features and advantages of the invention, its organization, construction and operation will be best understood from the following detailed description taken in conjunction with the accompanying drawings, on which.

DESCRIPTION OF THE PREFERRED EMBODIMENT

Figure 1:
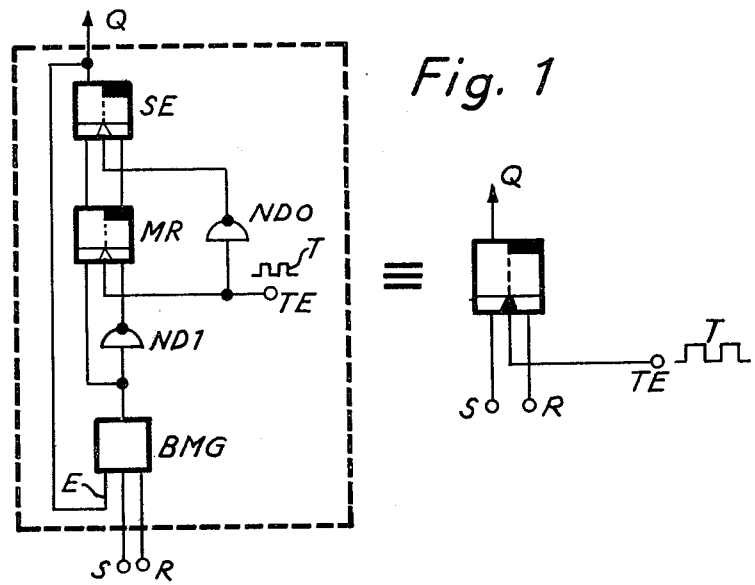
FIG. 1 is a schematic illustration of an RS master-slave flip-flop having feedback by way of a majority decision circuit.

The switching arrangement illustrated in FIG. 1 shows a known electronic storage element for switching variables in the form of dynamic signals, in which the content of information resides in the phase position of the respective signals with respect to predetermined reference signals. In the left portion of FIG. 1 an individual illustration of the elements is provided for the switching arrangement using well known symbols. In the right portion of FIG. 1, a symbol for the entire storage element as utilized in the exemplary embodiments of the invention is illustrated for such a storage element which has features by means of which the initially mentioned truth table and the corresponding Boolean equation are fulfilled.

In the left part of FIG. 1 the storage element is illustrated as comprising a RS master-slave flip-flop including a master MR and a slave SE. The pulse signals T which are necessary for controlling the slave SE and the master MR, respectively, are supplied by way of a timing input TE to the master MR and to the subsequently connected slave SE indirectly by way of an inverter ND0. The signal input in the RS master-slave flip-flop does not take place, in the usual manner directly by way of the master MR, but by way of a component group BMG connected ahead of the master MR.

The circuit BMG has three inputs E, S and R and has the object of performing a majority decision of switching variables connected at the three inputs E, S and R in the form of predetermined signal voltages and in connection with inversion of the output signal. A circuit arrangement for performing such a majority decision is illustrated, for example, in FIG. 4 wherein the left-hand portion of the figure illustrates the circuit in the form of individual components while the right portion of the figure illustrates the symbol used for the circuit in connection with the present invention. The output signals of the circuit BMG are conducted directly to the set input of the master MR and to the reset input by way of a further inverter ND1.

When a majority decision circuit without output signal inversion is utilized, the two input connections to the master MR merely has to be exchanged with respect to the circuit illustration in FIG. 1.

The output Q of the storage element of FIG. 1 is connected with the first input E of the circuit BMG by way of a feedback path. The other two inputs S and R of the majority decision circuit BMG are provided to receive switching variables whose respective logical values during the use of the storage element in positive or negative logic is determined either by the phase position of rectangular signal voltages with respect to a given reference signal voltage, or by the respective amplitude of the signal voltages employed. In the first case, the rectangular signal voltages used as switching variables have a phase difference of 180° if their logical values differ. When using the storage element according to the left part of FIG. 1 for static signals, an additional inverter must be provided in the feedback path between the slave SE and the input E of the component group BMG. This may be carried out, for example, by connecting the input E of the majority decision circuit BMG with the other output (not illustrated) of the slave SE.

The storage element briefly described above, which is to be employed for the construction of synchronous shift registers, will be illustrated in the following exemplary embodiments of the invention in order to simplify the manner of representation, as simple pulse controlled flip-flops with two inputs S and R, and an output Q, and a timing pulse input T as illustrated in the right portion of FIG. 1.

Figure 2:
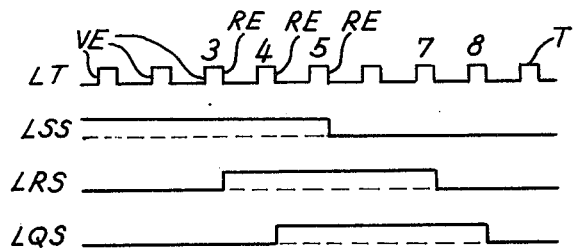
FIG. 2 is a timing diagram showing, in several diagram lines, the time-wise course of signal voltages in dependence on the logical value of the switching variables associated with these signal voltages, whose value is provided by the respective amplitude of the signal voltages.
Figure 3:
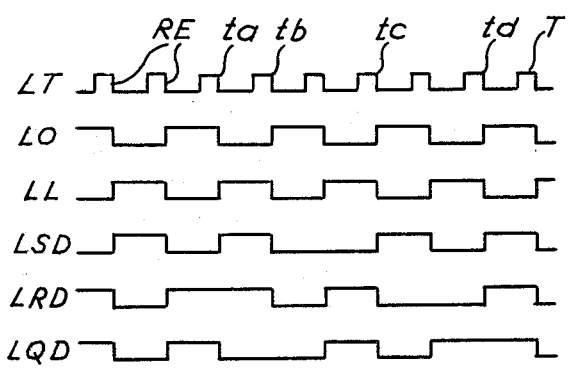
FIG. 3 is a timing diagram showing, in several diagram lines, rectangular signal voltages for the representation of switching variables, whose logical values can be determined from the respective phase positions of the signal voltages with respect to predetermined comparison signals.

FIGS. 2 and 3 illustrate, in an identical manner, in the upper diagram line LT the periodic course of pulse signals T for the pulse input of the storage element of FIG. 1. Each time a leading edge VE of the pulse signals T is present, the master MR is set or reset into the illustrated basic position in accordance with the signal configuration at its set and reset inputs. The same operation is caused, in the case of the master MR as well as the slave SE during the switching on process by wiring techniques which are not illustrated herein. The slave SE remains blocked when the master MR is set or reset, respectively. The signals provided by the master MR are transferred each time to the slave SE during the following trailing edge RE of the respective pulse signal. The master MR is blocked during this transfer time. The utilization of selectively different signal voltages for the switching variables was basically referred to in the first portion of this description. In digital data processing, one distinguishes between high and low signal levels of signal voltages for the representation of the logical values O and L of the switching variables. In the widely used TTL technique in positive logic, a scaling has been carried out to such an extent that a switching variable with the value O is represented by a signal voltage of about 0 volt, while in comparison the logical value L is at about 3.5 volts.

The wave forms of signal voltages in the diagram lines LSS, LRS and LQS of FIG. 2 are also true for positive logic so that the switching variable of the value L is fed to the input S of the storage element of FIG. 1 up to the trailing edge RE of the pulse signal 5. which has a high signal level.

It should be set forth once again at this point that the arrangement represented herein in accordance with FIG. 1 is designed only for dynamic signals according to FIG. 3. In the event that static signals according to FIG. 2 are utilized, an inversion must be provided--such an inversion not being illustrated--in the feedback line between the slave SE and the input E of the majority decision circuit BMG.

As shown in the diagram line LRS, the reset input R of the storage element of FIG. 1 receives, also with a high signal level, the switching variable of the value L which is timed to occur following the trailing edge RE of the pulse signal 3 up to the trailing edge of the pulse signal 7. In the case of a low signal level, the conditions for the set input S and the reset input R of the storage element according to FIG. 1 reverse. The wave form of the signal at the output Q is illustrated in the diagram line LQS. This signal carries a high signal level from the trailing edge RE of the pulse signal 4 up to the trailing edge RE of the pulse signal 8 (compare diagram line LT), which corresponds to the switching variable of the value L. This storage result can easily be obtained when using the Boolean equation $$Qt1 = S \cdot R + Qto \cdot (S + R)$$

which each time considering the logical values of the variables at the input S and the input R as well as the respective "old" logic state Qto at the output Q. The Boolean equation can be applied for the storage element with static as well as with dynamic signals for the illustration of the required switching variables.

Rectangular signal voltages having a predetermined repetition frequency are illustrated in the diagram lines LO, LL, LSD, LRD and LQD of FIG. 3. The signals in the lower three diagram lines LSD, LRD and LQD represent, at comparable moments of time, the same logic value of the switching variables as the signal wave forms of the lines LSS, LRS and LQS illustrated in FIG. 2. However, there is an essential difference between the wave forms of FIG. 2 and FIG. 3 in that the respective value of a switching variable is provided by signals which, on the one hand, are static and, on the other hand, are dynamic. The respective value results either from the amplitude or, in the other case from the phase position. The rectangular signal voltages illustrated in the diagram lines LO and LL of FIG. 3 are principally shifted in phase with respect to each other by 180°, and represent the two possible logic values O and L of switching variables, and they serve as comparison values or reference signals. The second diagram line LO of FIG. 3 illustrates, accordingly, the wave form and in particular the phase position of signal voltages which are present on one or both of the inputs S and R or on the output Q of the storage element illustrated in FIG. 1, respectively, with the logical value 0. The diagram line LL illustrates the wave form of signal voltages which illustrate by their phase position the logical value L of the switching variables at the inputs S and R, or at the output Q, respectively, of the storage element according to FIG. 1.

In order to aid in understanding and using the preferred dynamic signals according to FIG. 3 in connection with the example of the storage element according to FIG. 1, it is at first assumed that the set input S of the storage element receives a switching variable whose wave form is illustrated in the diagram line LSD. The same is true, analogously, for the reset input R which has the switching variable in the diagram line LRD associated with that input. The wave form of the signal at the output Q of the storage element of FIG. 1, which is associated with these two signals, or with the switching variables, is readily apparent in the diagram line LQD.

In order to make a comparison of the signal configurations provided in the diagram lines according to FIG. 3 with the truth table for the storage element, the truth table is again stated here once more as follows:

| S | R | Qto | Qt1 |
|---|---|-----|-----|
| L | O | O | O |
| L | L | O | L |
| O | L | L | L |
| O | O | L | O |
| L | O | L | L |
| L | L | L | L |
| O | L | O | O |
| O | O | O | O |

A comparison of the diagram lines LSD, LRD and LQD with the diagram lines LO and LL in connection with pulse signals T in the diagram line LT shows that the input variables have the value L at the set input S of the storage element up to the time ta and have the logical value O at the reset input R, while the value of the signal at the output Q of the storage element of FIG. 1 is also O. The respective "old" signal state at the output Q of the storage element is identified as Qto in the truth table before the slave SE has taken on the signal configuration existing at the inputs S and R of the majority decision circuit BMG. A value generally identified in the truth table as Qt1 is the value of the output signal which applies for the output Q of the storage element always at the trailing edge RE of the successive pulse signal T.

It can be seen in the diagram line LRD that after the time ta, the switching variable existing at the reset input R of the storage element changes its value from a logical O to a logical L since the signal illustrated in the diagram line LRD is now in phase with that signal which is illustrated in the diagram line LL as the reference signal. The values of the signal configuration at the inputs S and R as well as the output Q of the storage element, which values are assumed in the present working example, can be taken from the second line of the truth table as S = L, R = L and Qto = L.

After the time tb, the storage element emits a rectangular signal with the value L after the majority decision has taken place and after the transfer by the slave SE at the output Q. In order to detect this, the diagram line LQD and LL should be compared after the instant tb. It is noticeable tht the mentioned signal wave forms coincide with respect to phase position from the time tb on.

After the pulse signal located between the times tb and tc, the value of the first switching variable and therefore the corresponding signal at the input S of the storage element has changed from a logical L to a logical O, as can be seen by comparing the diagram line LSD and the third line of the truth table. At the time tc, the logical value L is still at the output Q as a result of the change of the input variable, as can be seen from the diagram line LQD in connection with the reference signal of the diagram line LL.

The logical values O and O of the input variables at the inputs S and R of the storage element of FIG. 1, as stated in the fourth line of the truth table, and the logical value L at the output Q, exist after the trailing edge of the pulse signal T located between the time tc and td after, in addition, the value of the input signal at the reset input R of the storage element has changed (see the diagram line LRD). In dependence on this predetermined signal configuration, the slave SE gives off a signal after the transfer of information at the time td by way of the output Q which corresponds to a switching variable having the logical value O.

Figures 4, 5:
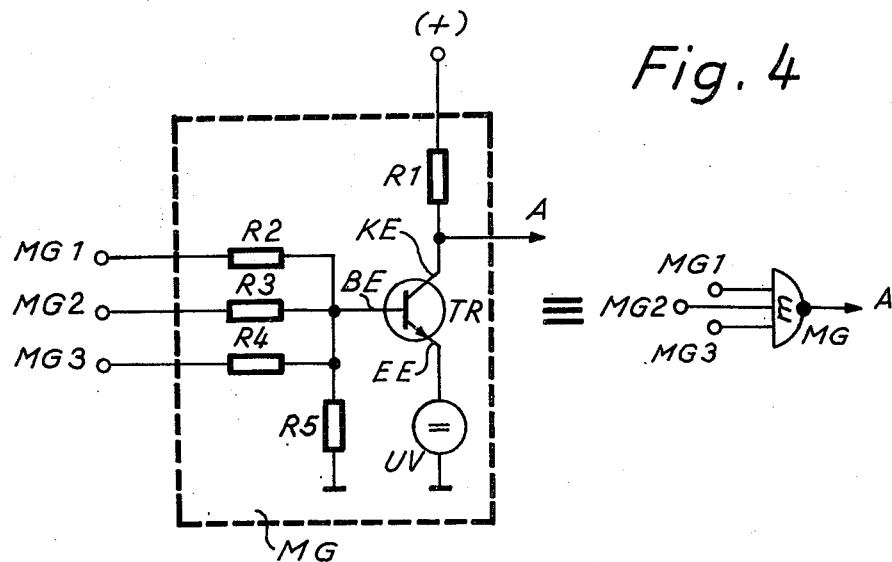
FIG. 4 is a schematic circuit diagram of a majority decision circuit for accommodating three variables, and the logic symbol used for the majority decision circuit.
FIG. 5 is a truth table for the switching arrangement illustrated in FIG. 4.

FIG. 4 illustrates, in the left portion thereof, a preferred embodiment of a circuit for performing a majority decision of three variables with output signal inversion. The circuit is illustrated with individual components in the left-hand portion of FIG. 4, while the right hand portion of FIG. 4 illustrates the associated symbol used in the exemplary embodiments of the invention. The majority decision circuit MG essentially comprises a transistor TR having a collector electrode KE which is connected to a positive potential by way of a load resistor R1. A resistor network comprising three further resistors R2, R3 and R4 is connected with the three inputs MG1, MG2 and MG3 and to the base electrode BE of the transistor TR. In addition, the base electrode BE is connected to ground potential by way of a further resistor R5. By means of a voltage source UV in the emitter circuit of the transistor TR, the emitter electrode EE is applied to a positive potential which is above the reference or ground potential. It is guaranteed, by this structure, that the transistor TR is blocked when there are no signals at the inputs MG1--MG3. The transistor TR switches through only at that moment when two of the inputs MG1--MG3 have the switching variable L and receive electrical signals in such a way that the voltage drop at the resistor R5 is greater than the voltage of the voltage source UV plus the threshold voltage between the base electrode BE and the emitter electrode EE of the transistor TR. The result of a majority decision of three values of switching variables applied by way of the inputs MG1--MG3 is provided at the output A in an inverted form.

In the truth table according to FIG. 5 for the majority decision circuit, the inputs MG1, MG2 and MG3 and the output A are indicated. In this context it may be pointed out that the three inputs MG1--MG3 of the majority decision circuit are entirely equivalent, which is readily apparent by the resistor matrix R2--R4.

It is assumed in block I of FIG. 5 that with all four variation possibilities of switching variables at the inputs MG2 and MG3, the input MG1 is charged with this switching variable having the logical value O. It can be easily realized by comparison of the values of switching variables provided for the inputs MG1--MG3 with the logic result in column A that the majority decision circuit MG operates, in this assumed case, as a NAND gate. However, if the switching variable with the logical value L is applied to the input MG1, as can be seen in the block II of FIG. 5, the switching variables applied to the remaining inputs MG2 and MG3 are then linked in accordance with a NOR function.

As mentioned above, the invention is based on the overall object of providing, with as few component parts as possible, a shift register having series and parallel inputs, as well as a basic position input which can be switched on and off, by employing prior art switching circuits such as those illustrated in FIGS. 1 and 4, which shift register can be used with a high degree of fault safety.

The above object is realized, according to the invention, in that a first majority decision element having three inputs and operating without output signal inversion is connected to the set input of each storage element of a chain of storage elements, and a second majority decision circuit operating with output signal inversion is connected to the associated reset input, whereby the one input of each of the two majority decision circuits anti-valent (out of phase) shifting information of the preceding storage element (or from the series data input to the shift register) respectively, are applied. Each one other input of all first or second, respectively, majority decision elements is connected with the output of a first or second, respectively, OR gate. Each OR gate has an input connected in common with a like input of the other OR gate and serve as switch-on inputs. An AND gate is connected to the respective third input of the first majority decision circuits and each of these AND gates includes one input which functions as a parallel data input for the register and a second input connected to all other second inputs of such AND gates and to a second input of the associated OR gate as an order input to receive an order signal as to the type of processing involved. The third inputs of the second majority decision circuits are connected to each other and to one of the inputs of the second OR gate associated therewith to form the basic position input for receiving a signal to preset the register to a predetermined basic condition.

Such a shift register may also be a closed circuit arrangement so that with a switched on register a continuous cycling or information circulation of a fed in bit pattern can take place.

A simple embodiment of the invention is illustrated in the drawings and will be explained in greater detail as follows. In order to simplify the manner of representation, the shift register illustrated in FIG. 6 comprises only three stages having the storage elements SPG1, SPG2 and SPG3. The pulse inputs of these three storage elements are connected together and are connected to the common pulse input TE1.

It is essential for the individual stages of the shift register that the individual storage elements SPG1--SPG3 have their respective set inputs SG1, SG2 and SG3 connected with a first majority decision circuit MD11, MD12 and MD13 with an intermediately connected respective inverter ND11, ND12 and ND13. This combination of switching elements at each set input replaces a majority decision circuit which operates without output signal inversion.

A respective second majority decision circuit MD21, MD22 and MD23, operating with output signal inversion, is connected to each reset input RG1, RG2 and RG3 of the respective storage elements SPG1--SPG3. The outputs of the three storage elements SPG1--SPG3 are identified with the respective reference characters A1, A2 and A3.

The chain-like construction of the shift register comprising the individual storage elements is manifest in that anti-valent shift information of the preceding storage element are supplied by way of an input of the first and second majority decision circuits which are connected to a common storage element. Therefore, for example, the output of the storage element SPG1 is connected with an input of the majority decision circuit MD12, and the other output of the storage element SPG1 is connected with an input of the second majority decision circuit MD22 which is also associated with the storage element SPG2. A certain exception is the first storage element SPG1 and the associated majority decision circuits MD11 and MD21 insofar as these majority decision circuits are not connected with the outputs of a preceding storage element. Rather, the first majority decision circuit MD11 is connected directly with the serial data input SEG of the shift register, and an input of the second majority decision circuit MD21 is connected with the series data input SEG by way of an inverter ND10. By means of this structure, the majority decision circuits MD11 and MD21 which are associated with the first storage element SPG1 also receive anti-valent shift information.

The basic position input GSG is connected, on the one hand, by way of an OR gate O2 with an input of each of the second majority decision circuits MD21, MD22, and MD23 which operate with output signal inversion. A further input of these majority decision circuits is connected directly to the basic position input GSG.

Since the existing shift register does not already carry out a shifting of stored data on account of pulse signals conducted over the pulse input TE1, but that for this purpose a special switch-on signal is needed, a switch-on input ESG is provided for such a signal. The input ESG is connected, on the one hand, with an input of the OR gate O2 and, on the other hand, with an input of another OR gate O1. The OR gate O1 has its output connected to an input of each of the first majority decision circuits MD11, MD12 and MD13.

A respective AND gate UD1, UD2 and UD3 is connected to the third and so far unmentioned input of the first majority decision circuits MD11--MD13 and these switching elements together serve for a parallel input of bit patterns into the shift register. This input takes place by way of the parallel inputs PG1, PG2 and PG3 in the case of a corresponding order by way of the order input EBG which is connected with one input of each of the AND gates UD1--UD3 and with an input of the OR gate O1.

When considering the mode of operation of a shift register constructed in accordance with the invention, one first proceeds from the assumption that the individual storage elements SPG1--SPG3 are in the illustrated basic position at which, therefore, data with the logical value O is provided by way of the outputs A1--A3. Furthermore, one assumes that the basic position input GSG, as well as the order input EBG, receives a signal with the logical value O. By means of this, a signal with the logical value O is applied on at least one input of the first and second majority decision circuits MD11--MD13 and MD21--MD23, independent from the logical value of the signals at the switchon input ESG and the series data input SEG. According to the explanations set forth above for the mode of operation of the majority decision circuits (compare FIGS. 4 and 5), this means that the first majority decision circuits MD11--MD13 operate as AND gates in connection with the inverters ND11--ND13 which are connected to the outputs of the majority decision circuits MD11-MD13, while all second majority decision circuits MD21--MD23 are present as NAND gates.

As soon as a signal with the logical value L is applied to the switch-on input ESG, the shift register content is shifted in the repetition frequency of pulse signals provided at the timing pulse input TE1 from the storage elements of low degree in the direction of those of higher degree. For this purpose, a bit pattern can be fed into the shift register, which was presumed to be erased, by way of the series data input SEG. The input into the shift register and acceptance of the data take place as a function of the periodic repetition of the timing pulses. The fed in bit pattern is again erased when the basic position input GSG receives a signal having the logical value L, while the switch-on input ESG and the order input EBG carry signals of the logic value O. The signal with the logic value L at the basic position input GSG is applied to the majority decision circuits MD21, MD22 and MD23 directly and indirectly by way of the OR gate O2 so that the inputs of the majority decision circuits receive a signal of the logic value L on at least two of their three inputs. The value of the signal at the respective third input is dependent on the storage state of the respective preceding storage element or, in the case of the first stage, on the signal applied to the inverter ND10, respectively.

Assuming that the logical value O is applied to the series date input SEG, the majority decision circuit MD21 receives the logical value L on all three inputs and operates as a NOR gate together with the remaining second majority decision circuits MD22 and MD23. Since the three inverters ND11, ND12 and ND13 provide a signal of the logical value O, due to the configuration of the input variables at the majority decision circuits MD11, MD12 and MD13, the storage elements SPG1--SPG3 are brought into the basic position in consideration of the truth table applicable for these storage elements.

If the recording of a bit pattern into the shift register is to take place in parallel, rather than in series and the data is applied simultaneously, rather than in a serial pattern, a data word, in this case consisting of three bits, is applied by way of the parallel inputs PG1--PG3. The input time is predetermined by a corresponding signal at the order input EBG, the AND gates UD1--UD3 being blocked and not able to assume an open condition without a corresponding input signal. The input takes place at that time at which the input EBG carries a signal with the logical value L and the other inputs ESG, SEG and GSG carry a signal with the logical value O. If the bit pattern, which was fed into the shift register by way of the parallel inputs PG1--PG3, is to be shifted subsequently, the order input EBG is set to a logical value O and the switch-on input ESG is charged with the logical value L. The bit pattern is then given off serially by way of the output A3 to subsequent circuits which are not illustrated on the drawing.

Figure 6:
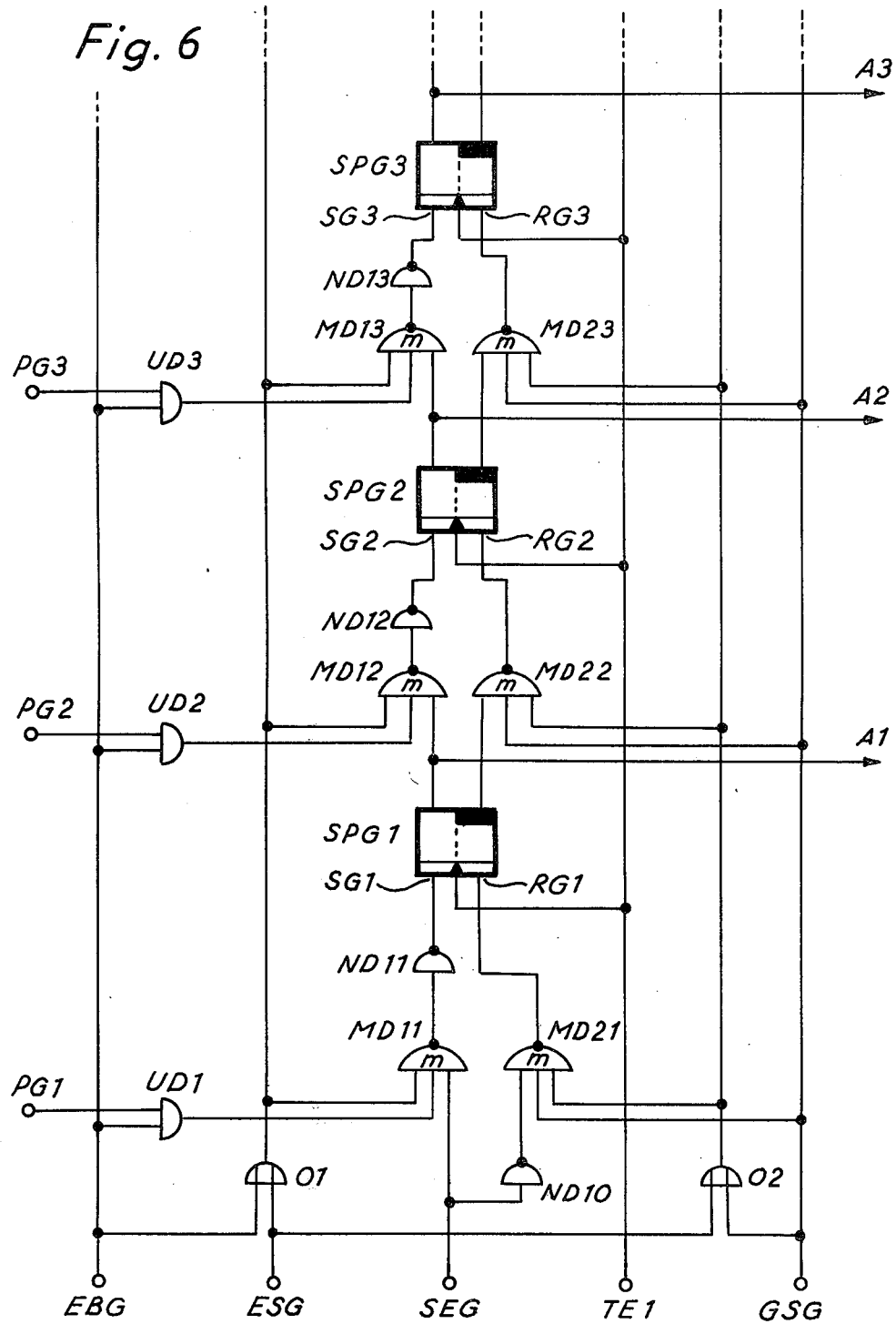
FIG. 6 is a schematic circuit diagram of a shift register constructed in accordance with the invention and utilizing the circuits illustrated in FIGS. 1 and 4.

The shift register circuit according to FIG. 6 can be altered easily to the effect that the parallel inputs PG1, PG2 and PG3 are eliminated. The AND gates UG1, UG2 and UG3 are then superfluous and not required. The inputs of the majority decision circuits MD11, MD12 and MD13 which are connected to the AND gates as illustrated in FIG. 6, are in this case connected directly with the order input EBG. Such a circuit is designed symmetrically with respect to the setting and with the aid of signals by way of the order input EBG and with respect to resetting by way of the basic input position GSG.

If only a certain portion of all storage elements of the register is to be set, then only the set inputs of these storage elements are connected with the order input EBG. The remaining set inputs are continuously charged, in this case, with the logical value O.

Although I have described my invention by reference to a particular illustrative embodiment thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. A synchronous shift register comprising:
 a plurality of storage elements, each of said storage elements including
  a master-slave flip-flop comprising a master stage having a pair of inputs and a pair of outputs, a slave stage having a pair of inputs connected to respective outputs of said master stage and a pair of outputs which constitutes an output Q of an output $\overline{Q}$ of said storage element, said master stage and said slave stage each having a timing input,
  a first inverter,
  a timing pulse input for receiving periodic timing pulses,
  said timing pulse input connected to said timing input of said master stage and via said inverter to said timing input of said slave stage,
  a second inverter, and
  a majority decision circuit including an output connected to that input of said master stage which is opposite to the said output Q and via said second inverter to the other of said inputs of said master stage, a first input constituting a set input S of said storage element, a second input constituting a reset input R of said storage element and a third input connected to said output Q so that said storage element fulfills the truth table

| S | R | Qto | Qtl |
|---|---|-----|-----|
| L | O | O | O |
| L | L | O | L |
| O | L | L | L |
| O | O | L | O |
| L | O | L | L |
| L | L | L | L |
| O | L | O | O |
| O | O | O | O | which corresponds to the Boolean equation $Qt1 = S \cdot R + Qto \cdot (S + R)$ where Qt1 is a new logic state which is dependent on the applied logic values of S and R and Qto is the stored logic state of the slave stage;

a plurality of third inverters connected to respective ones of said set inputs S;

a plurality of second majority decision circuits, each of said second majority decision circuits including an output connected to a set input S of a storage element by way of a respective one of said third inverters, a first input connected to said output Q of the preceding storage element of the chain to receive serial pulses with said first input associated with the first storage element of the chain constituting a serial input for the shift register, a second input and a third input;

a switch-on input for receiving a potential to permit data shifting;

an order input for receiving an order signal indicating parallel data input;

a plurality of AND gates each including an output connected to a respective third input of said second majority decision circuits, a first input connected to said order input, and a second input for receiving parallel information;

a fourth inverter having an input connected to said serial input, and an output;

a basic position input for receiving an input pulse to set said shift register to a predetermined basic position;

a plurality of third majority decision circuits, each of said third majority decision circuits including an output connected to said reset input R of a respective storage element, a first input connected to the output $\overline{Q}$ of the preceding storage element with the first input of the majority decision circuit associated with the first storage element of the chain connected to said output of said fourth inverter, a second input, and a third input connected to said basic position input;

a first OR gate including an output connected to said second input of each of said second majority decision circuits, a first input connected to said switch-on input and a second input connected to said order input; and a second OR gate including an output connected to said second input of each of said third majority decision circuits, a first input connected to said switch-on input, and a second input connected to said basic position input.

2. A synchronous shift register comprising:

a plurality of master-slave flip-flops connected in a series chain and each including a set input S, a reset input R, a timing input, an output Q, an output $\overline{Q}$ and operable to fulfill the truth table

| S | R | Qto | Qt1 |
|---|---|-----|-----|
| L | O | O | O |
| L | L | O | L |
| O | L | L | L |
| O | O | L | O |
| L | O | L | L |
| L | L | L | L |
| O | L | O | O |
| O | O | O | O | which complies with the Boolean equation $Qt1 = S \cdot R + Qto \cdot (S + R)$ where Qto is the logical condition of the output Q prior to new information transfer in a counter flip-flop and Qt1 is the logical condition resulting after such information transfer;

a plurality of first majority decision means each including an output connected to the set input of a respective flip-flop, a first input connected to receive serial data with said first input of the majority decision means associated with the first flip-flop of the chain constituting a serial data input for the shift register and said first input of the remaining majority decision means connected to the output Q of the preceding flip-flop, a second input and a third input;

a plurality of parallel data inputs associated with respective ones of said flip-flops;

first control means connected to said second and third inputs and to said parallel data inputs for selectively conditioning said shift register to receive serial or parallel data;

a timing pulse input connected to each of said timing inputs to control synchronous operation of said flip-flops;

an inverter;

a plurality of second majority decision means each including an output for inverted signals connected to the reset input of a respective flip-flop, a first input connected to the output $\overline{Q}$ of the preceding flip-flop with the first input associated with the first flip-flop of the chain connected via said inverter to said serial data input, a second input and a third input;

a basic position input for receiving signals to preset said shift register into a predetermined basic logic position; and second control means connecting said second and third inputs of said second majority decision means to said basic position input to effect presetting of said shift register.

* * * * *